(12) United States Patent
Landau et al.

(10) Patent No.: US 8,129,225 B2
(45) Date of Patent: Mar. 6, 2012

(54) METHOD OF MANUFACTURING AN INTEGRATED CIRCUIT MODULE

(75) Inventors: Stefan Landau, Wehrheim (DE); Alexander Koenigsberger, Regensburg (DE); Joachim Mahler, Regensburg (DE); Klaus Schiess, Allensbach (DE)

(73) Assignee: Infineon Technologies AG (DE)

( * ) Notice: Subject to any disclaimer, the term of this patent is extended or adjusted under 35 U.S.C. 154(b) by 664 days.

(21) Appl. No.: 11/837,087

(22) Filed: Aug. 10, 2007

(65) Prior Publication Data
US 2009/0042337 A1 Feb. 12, 2009

(51) Int. Cl.
*H01L 21/00* (2006.01)

(52) U.S. Cl. ........ 438/123; 438/107; 438/110; 438/111; 438/112; 438/113; 438/121; 438/122; 438/124; 438/125; 438/126; 438/127

(58) Field of Classification Search .............. 438/107, 438/110–113, 121–127
See application file for complete search history.

(56) References Cited

U.S. PATENT DOCUMENTS

| | | | |
|---|---|---|---|
| 4,982,265 A | 1/1991 | Watanabe | |
| 5,365,106 A * | 11/1994 | Watanabe | 257/669 |
| 6,121,070 A * | 9/2000 | Akram | 438/108 |
| 6,307,255 B1 | 10/2001 | Stave | |
| 6,396,127 B1 | 5/2002 | Munoz et al. | |
| 6,693,350 B2 * | 2/2004 | Teshima et al. | 257/712 |
| 6,812,063 B2 * | 11/2004 | Huang | 438/110 |
| 6,844,219 B2 * | 1/2005 | Kitano et al. | 438/123 |
| 2002/0027276 A1* | 3/2002 | Sakamoto et al. | 257/690 |
| 2003/0048624 A1 | 3/2003 | Damberg | |
| 2004/0063240 A1 | 4/2004 | Madrid et al. | |
| 2004/0080028 A1 | 4/2004 | Yanagisawa | |
| 2005/0023658 A1 | 2/2005 | Tabira et al. | |
| 2005/0056927 A1 | 3/2005 | Teshima et al. | |
| 2005/0093136 A1 | 5/2005 | Liu et al. | |
| 2007/0132091 A1 | 6/2007 | Wu et al. | |
| 2007/0138618 A1 | 6/2007 | Park et al. | |
| 2009/0008795 A1* | 1/2009 | Honer et al. | 257/777 |

FOREIGN PATENT DOCUMENTS

| | | |
|---|---|---|
| CN | 1828853 A | 9/2006 |
| CN | 1925120 A | 3/2007 |
| WO | 2006052616 A1 | 5/2006 |

* cited by examiner

*Primary Examiner* — Kevin M Picardat
*Assistant Examiner* — Bac Au
(74) *Attorney, Agent, or Firm* — Edell, Shapiro & Finnan, LLC (57) ABSTRACT

A method includes providing an integral array of first carriers, arranging first semiconductor chips on the first carriers, and arranging an integral array of second carriers over the semiconductor chips.

25 Claims, 7 Drawing Sheets

METHOD OF MANUFACTURING AN INTEGRATED CIRCUIT MODULE

BACKGROUND

Power semiconductor chips may, for example, be integrated into semiconductor modules. Power semiconductor chips are suitable, in particular, for the switching or control of currents and/or voltages.

SUMMARY

A method of manufacturing an integrated circuit module is described herein. The method comprises providing an integral array of first carriers, placing first integrated circuit chips (e.g., semiconductor chips) on the first carriers, and placing an integral array of second carriers over the integrated circuit chips.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to accompanying drawings, where.

DETAILED DESCRIPTION

In the following exemplary embodiments are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the exemplary embodiments. It may be evident, however, to one skilled in the art that one or more aspects of the exemplary embodiments may be practiced with a lesser degree of these specific details. The following description is therefore not to be taken in a limiting sense.

Modules with integrated circuit chips (e.g., semiconductor chips) and fabrication methods thereof are described below. The semiconductor chips may be of extremely different types and may include for example integrated electrical or electro-optical circuits. The semiconductor chips may, for example, be configured as power transistors, power diodes, IGBTs (Insulated Gate Bipolar Transistor), control circuits, microprocessors or microelectromechanical components. In particular, semiconductor chips having a vertical structure may be involved, that is to say that, the semiconductor chips may be fabricated in such a way that electric currents can flow in a direction perpendicular to the main surfaces of the semiconductor chips. A semiconductor chip having a vertical structure may have contact elements in particular on its two main surfaces (i.e., on its top side and bottom side). In particular, IGBTs, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The semiconductor chips may be placed on carriers or plates. Furthermore, carriers or plates may be placed on the semiconductor chips. The carriers and plates may be of any shape, size or material. During the fabrication of the modules the carriers may be connected to each other. The carriers may also be made from one piece. The carriers may be connected among each other by carrier connectors with the purpose of separating the carriers in the course of the fabrication. Similarly, the plates on which the semiconductor chips are placed may be separated during the fabrication. Separation of the carriers and plates may be carried out by mechanical sawing, a laser beam, cutting, stamping, milling or any other appropriate method. The carriers and plates may be electrically conductive. They may be fabricated from metals or metal alloys, in particular copper, copper alloys, aluminum, aluminum alloys, or other appropriate materials. Furthermore, the carriers and plates may be PCBs (Printed Circuit Boards). The carriers and plates may be, for example, a leadframe or a part of a leadframe.

The semiconductor chips include contact pads which allow electrical contact to be made with the semiconductor chips. The contact pads may comprise any desired electrically conductive material, for example of a metal, such as copper, aluminum or gold, a metal alloy or an electrically conductive organic material. The contact pads may be situated on the active surfaces of the semiconductor chips or on other surfaces of the semiconductor chips. In case of a power transistor, the contact pads include drain, source and gate terminals.

The modules described below include external contact pads. The external contact pads may be accessible from outside the module and may allow electrical contact to be made with the semiconductor chips from outside the module. Moreover, the external contact pads may be thermally conductive and may serve as heat sinks for dissipating the heat generated by the semiconductor chips. The external contact pads may comprise any desired electrically conductive material, for example of a metal, such as copper, silver or gold, a metal alloy or an electrically conductive organic material. The carriers or plates on which the semiconductor chips are placed or which are placed on the semiconductor chips may form the external contact pads. For example, surfaces of the carriers or plates may be used as external contact pads.

Surfaces of the modules, for example surfaces which are used as external contact pads, may form an assembly plane. The assembly plane may serve to mount the module onto another component (e.g., a circuit board).

A mold material may be used to cover at least parts of the semiconductor chips. The mold material may be any appropriate thermoplastic or thermosetting material. Various techniques may be employed to cover the semiconductor chips with the mold material (e.g., compression molding, injection molding, powder molding or liquid molding).

Figure 1A:
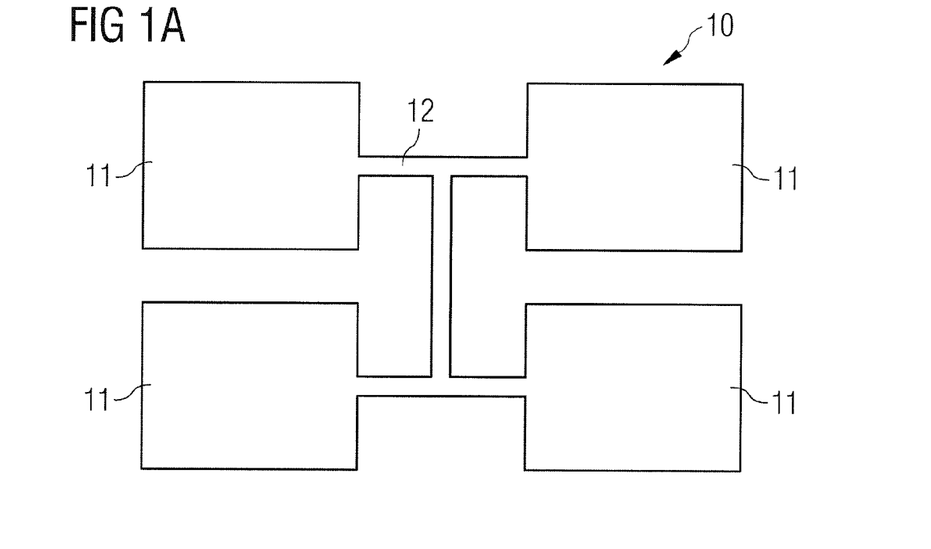
FIGS. 1A to 1F schematically illustrate a method to fabricate a module 100 according to an exemplary embodiment.
Figure 1B:
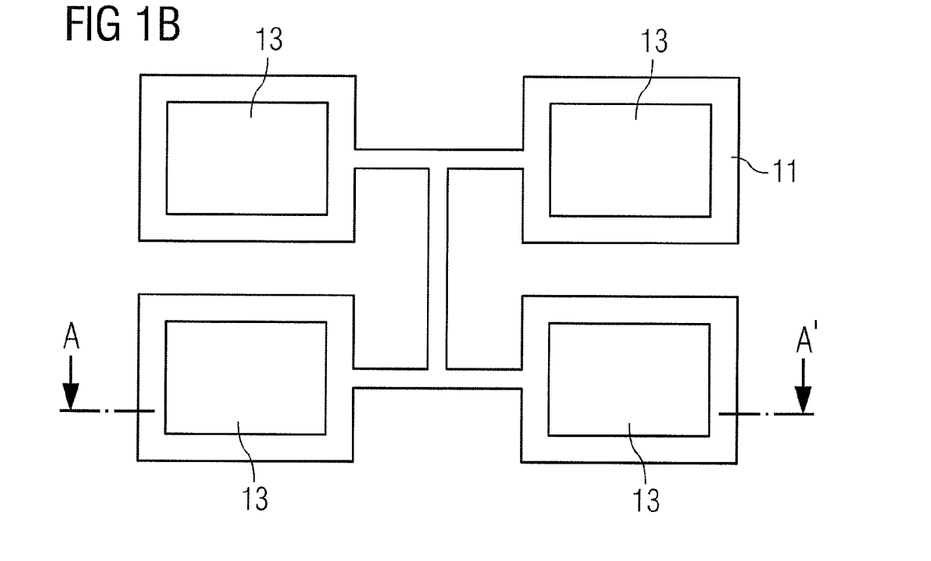
Figure 1C:
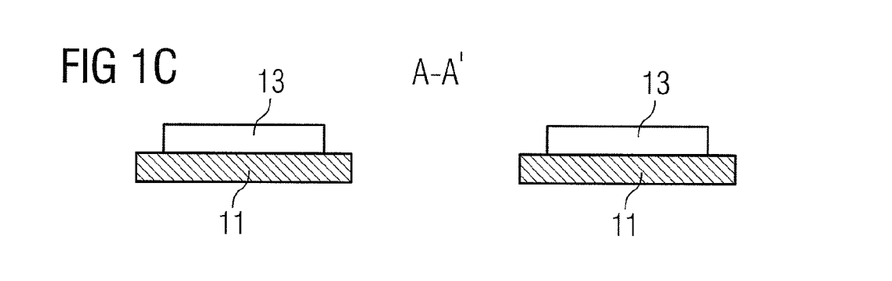
Figure 1D:
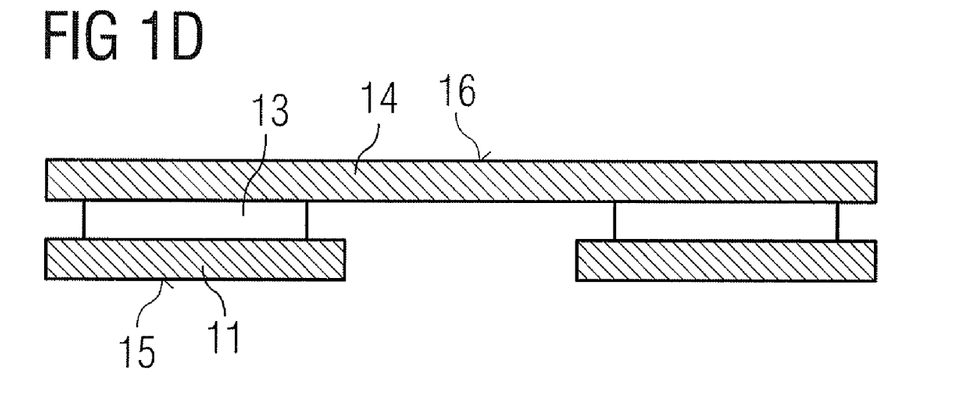
Figure 1E:
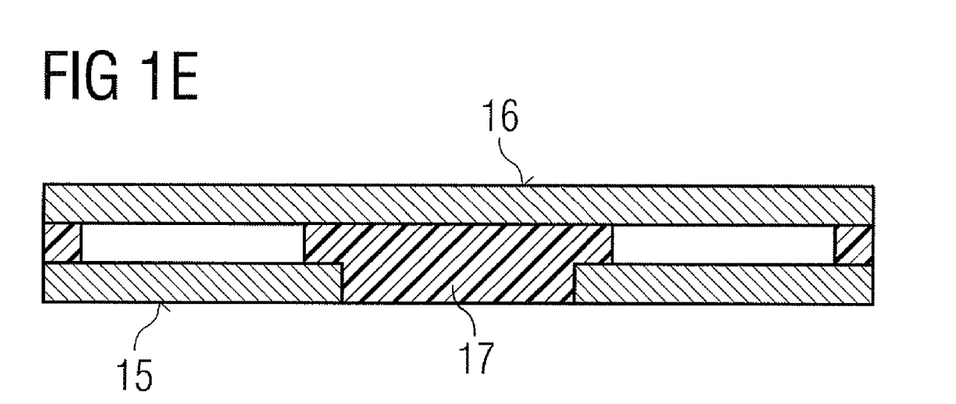
Figure 1F:
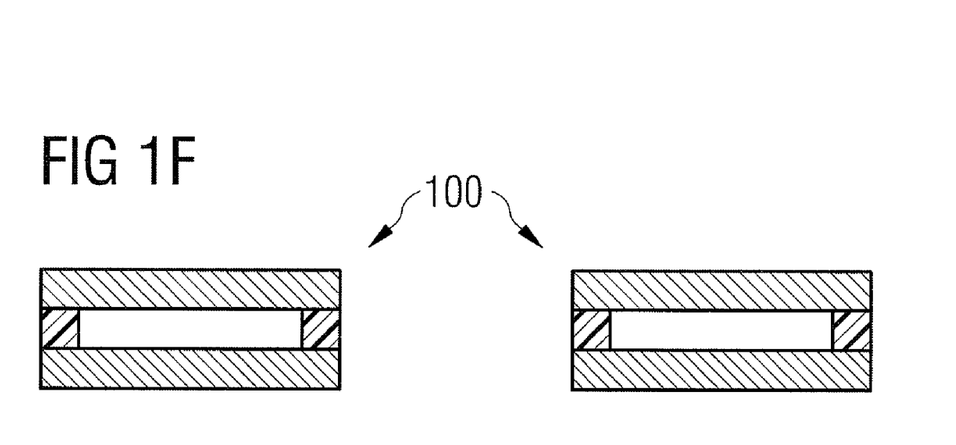

In FIGS. 1A to 1F the fabrication of modules 100, which are shown in FIG. 1F, is schematically illustrated as an exemplary embodiment. FIG. 1A shows a device 10 in a plan view which is an integral array of a plurality of first carriers 11. Carrier connectors 12, for example bond bridges, may connect the first carriers 11 with each other. The first carriers 11 and the Carrier connectors 12 may be made in one piece. They may be electrically conductive and may, for example, be made from a metal, such as copper, or a metal alloy or a PCB (Printed Circuit Board). When measured perpendicular to the drawing plane of FIG. 1A, the first carriers 11 may have a thickness in the range between 50 µm and 1 mm. If the first carriers 11 are fabricated from a metal or a metal alloy, they may have been plated with a layer of a Ni—NiP alloy, a Ni—NiP—Au alloy, a NiPd alloy, Au, Ag, Sn or any other appropriate material. This layer may be deposited galvanically on the first carriers 11 and may have a thickness of up to 100 µm. Furthermore, the aforementioned materials may be selectively deposited on different areas of the first carrier 11. The layer plated onto the first carriers 11 may serve as solder connection later on and may prevent corrosion of the first carriers 11.

In order to form the outer shape of the integral array of the first carriers 11 as for example illustrated in FIG. 1A, a plate may be stamped, pressed, punched, cut, etched or treated by any other appropriate method. The first carriers 11 may also be a leadframe or part of a leadframe, for example made of copper.

First semiconductor chips 13 are placed on the first carriers 11. It may be provided that on each of the first carriers 11 one first semiconductor chip 13 is placed, however it is also possible that a plurality of the first semiconductor chips 13 are placed on one first carrier 11. FIG. 1B illustrates the situation in a plan view when one first semiconductor chip 13 is placed on each of the first carriers 11. FIG. 1C illustrates this arrangement in cross section along a line A-A' depicted in FIG. 1B.

An integral array of second carriers 14 is placed over the first semiconductor chips 13. The integral array of the second carriers 14 may be fabricated from the same or similar materials as the integral array of first carriers 11, and the same or similar methods may be used for the fabrication thereof. The integral array of the second carriers 14 may be a leadframe or a portion thereof. Special embodiments of the second carriers 14 will be discussed below.

The first carriers 11 may have a first surface 15, and the second carriers 14 may have a second surface 16. Both surfaces 15 and 16 may be planar. The first semiconductor chips 13 may be mounted on the surfaces of the first carriers 11 opposite to the first surfaces 15. The second carriers 14 may be placed over the first semiconductor chips 13 such that the second surface 16 faces away from the first semiconductor chips 13 and that the first and second surfaces 15 and 16 are arranged plane-parallel.

A mold material 17 may be used to cover at least parts of the first semiconductor chips 13 and parts of other components of the modules 100 as shown in FIG. 1E. Portions of the first and second surfaces 15 and 16 or the entire surfaces 15 and 16 may be left uncovered by the mold material 17. The surfaces 15 and/or 16 or portions of them may be used as external contact elements to electrically couple the first semi-conductor chips 13 to external components. Furthermore, either the first surface 15 or the second surface 16 may be used as an assembly plane to mount the module 100 to other components, such as circuit boards. Further modules or components, such as heat sinks for example, may be attached to the other surface 15 or 16 which is not used as the assembly plane.

As shown in FIG. 1F the arrays of the first and second carriers 11 and 14 as well as the mold compound 17 may be separated, for example by employing mechanical sawing, a laser beam, cutting, stamping or milling, in order to obtain the modules 100. Alternatively, separation of the arrays of the first and second carriers 11 and 14 may be carried out before the mold material 17 is applied to the modules 100.

Instead of being regarded as the integral array of the first carriers 11, the device 10 shown in FIG. 1A may also be regarded as a first plate 10 in which recesses have been formed by removing material. The recesses or at least some of them may extend from one surface of the first plate 10 to the opposite surface. The recesses may have been fabricated, for example, by stamping, pressing, punching, cutting, etching or any other appropriate method. The first plate 10 may have been fabricated from the same material as the first carriers 11. Analogously to the integral array of the first carriers 11, the integral array of the second carriers 14 may also be regarded as a second plate 14 in which recesses have been formed. When it is referred to the integral array of first or second carriers 11 and 14 in the following, the first and second plates 10 and 14 are also considered and vice versa.

Figure 2A:
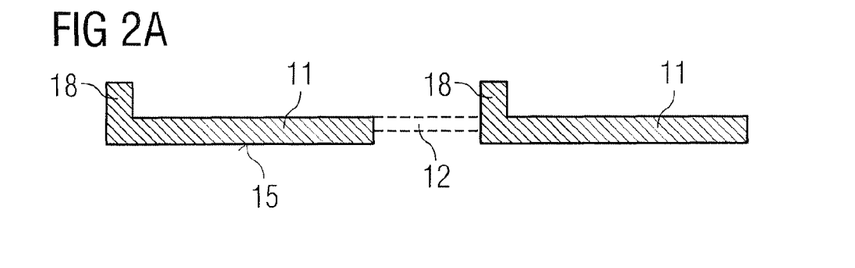
FIGS. 2A to 2E schematically illustrate a method to fabricate a module 200 according to an exemplary embodiment.
Figure 2B:
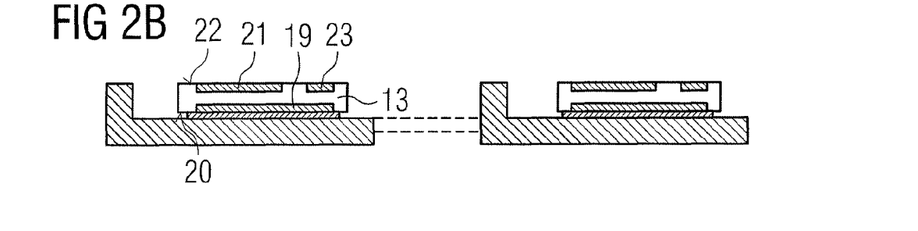
Figure 2C:
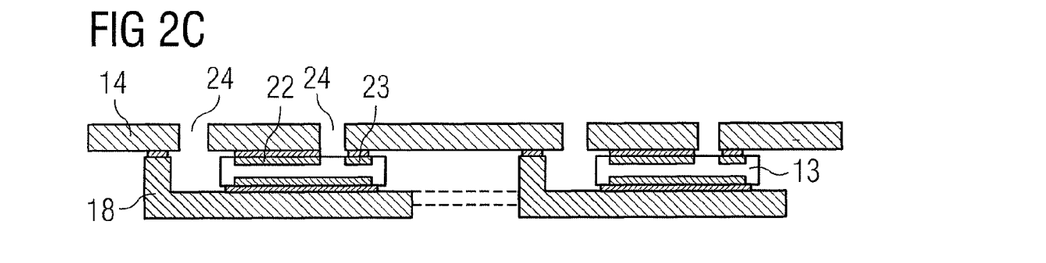
Figure 2D:
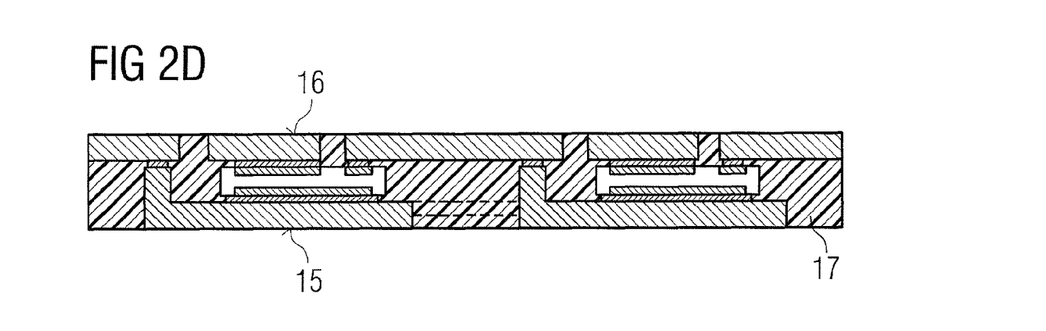
Figure 2E:
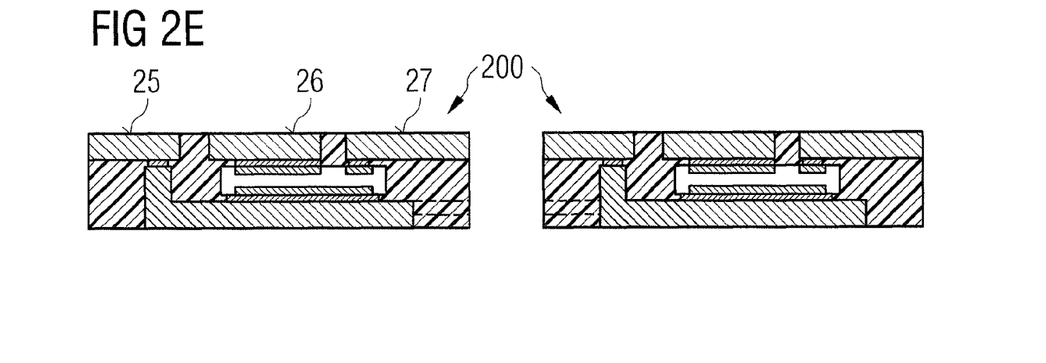

In FIGS. 2A to 2E the fabrication of modules 200, which are shown in FIG. 2E, is schematically illustrated as a further exemplary embodiment. The modules 200 and the fabrication method thereof are an implementation of the modules 100 and the fabrication method thereof shown in FIGS. 1A to 1F. Similar to the fabrication of the modules 100, the integral array of the first carriers 11 is initially provided when manufacturing the modules 200. Two of the first carriers 11 are illustrated in FIG. 2A in a cross section. It is to be noted that the integral array of the first carriers 11 may include more than the two first carriers 11 illustrated in FIG. 2A. The Carrier connectors 12, which connects the first carriers 11 with each other, is indicated by dashed lines.

The first carriers 11 may contain elements 18 which protrude from the first carriers 11. The elements 18 may, for example, extend in a direction perpendicular to the first surface 15. The first carriers 11 and the elements 18 may be fabricated in one piece.

The first semiconductor chips 13, which are mounted on the first carriers 11, may have a first contact pad 19 on a first main surface 20 and a second contact pad 21 on a second main surface 22 that is opposite to the first main surface 20. The first semiconductor chips 13 may, for example, be IGBTs (Insulated Gate Bipolar Transistor), vertical power diodes or vertical power transistors. In the latter case, the first and second contact pads 19 and 21 may be drain and source terminals, respectively. Furthermore, the first semiconductor chips 13 may have a third contact pad 23 on the second main surface 22 functioning as a gate terminal in the case the first semiconductor chips 13 are power transistors. The first semiconductor chips 13 are mounted onto the first carriers 11 with the first main surfaces 20 facing the first carriers 11 as shown in FIG. 2B. The first contact pads 19 may be electrically connected to the respective first carrier 11.

The electrical connections between the first contact pads 19 of the first semiconductor chips 13 and the first carriers 11 may, for example, be produced by reflow soldering, vacuum soldering, diffusion soldering or adhesive bonding via an electrically conductive adhesive.

If diffusion soldering is used as a connecting technique, it is possible to use solder materials which lead to intermetallic phases after the end of the soldering operation at the interface between the first carriers 11 and the respective first semiconductor chip 13 on account of interface diffusion processes. In this case, the use of Sn, AuSn, AgSn, CuSn, AgIn, AuIn, CuIn, AuSi or Au solders is conceivable, for example, for a copper or iron-nickel carrier 11. If the first semiconductor chips 13 are adhesively bonded to the first carriers 11, it is possible to use conductive adhesives which may be based on epoxy resins and be enriched with gold, silver, nickel or copper in order to produce the electrical conductivity.

The elements 18 of the first carriers 11 may be embodied such that their top surfaces form a plane which may be coplanar with the plane formed by the second main surfaces 22 of the first semiconductor chips 13. When the integral array of the second carriers 14 is placed over the first semiconductor chips 13, it is thus possible not only to electrically connect the second and third contact pads 21 and 23 of the first semiconductor chips 13 but also the elements 18 to the second carriers 14 as shown in FIG. 2C. These electrical connections may again be produced by reflow soldering, vacuum soldering, diffusion soldering or adhesive bonding via a electrically conductive adhesive. The integral array of the second carriers 14 may be a plate in which openings or recesses 24 have been formed. The recesses 24 may extend from the top surface of the plate down to its bottom surface. The recesses 24 ensure that the three contact pads 19, 21 and 23 of the first semiconductor chips 13 are electrically insulated from each other.

The widths of the recesses 24 may be in the range between 10 and 1000 µm, in particular in the range between 100 and 200 µm, and may depend on the geometry of the first semiconductor chips 13, in particular the arrangement of their contact pads 21 and 23, as well as the method the recesses 24 are produced.

Furthermore, the widths of the recesses 24 may also depend on the mold material 17 which is used to encapsulate the modules 200. The mold material 17 may contain a filling material consisting of small particles of glass ($SiO_2$), or other electrically insulating mineral filler materials like $Al_2O_3$, or organic filler materials. The mold material 17 may be injected through the recesses 24. In this case, the widths of the recesses 24 may depend on the used grain size of the filling material or vice versa. The grain size of the filler material may be in the range between 5 and 200 µm and in particular in the range between 40 and 80 µm.

The even and plane-parallel surfaces 15 and 16 are helpful when the first and second carriers 11 and 14 are clamped into a mold cavity. Firstly, protrusions from the surfaces 15 and 16 may damage the first semiconductor chips 11 when clamped into the mold cavity. Secondly, deviations from plane-parallelism of the surfaces 15 and 16 may cause the mold material 17 to unintentionally coat parts of the surfaces 15 and 16.

The mold material 17 may be applied to the modules 200 such that the first surface 15 and the mold material 17 form a common plane as shown in FIG. 2D. Moreover, the second surface 16 and the mold material 17 may also form a common plane.

The mold material 17 may be composed of any appropriate thermoplastic or thermosetting material, in particular it may be composed of material commonly used in contemporary semiconductor packaging technology. Various techniques may be employed to cover the components of the modules 200 with the mold material 17, for example compression molding or injection molding.

Before or after the molding, the first semiconductor chips 13 are separated from one another by separation of the first carriers 11, the second carriers 14 and, if necessary, the mold material 17. The separation may be carried out by employing mechanical sawing, a laser beam, cutting, stamping, milling or any other appropriate method.

As can be seen from FIG. 2E, each module 200 is arranged such that the three contact pads 19, 21 and 23 of the first semiconductor chips 13 can be electrically accessed from one side of the module 200. Three surfaces 25, 26 and 27 of the second carrier 14 are exposed and electrically coupled to the contact pads 19, 21 and 23, respectively. Furthermore, the surfaces 25, 26 and 27 are electrically insulated from each other. The surfaces 25, 26 and 27 may be used to electrically couple the module 200 to other components, for example a circuit board.

Figure 3A:
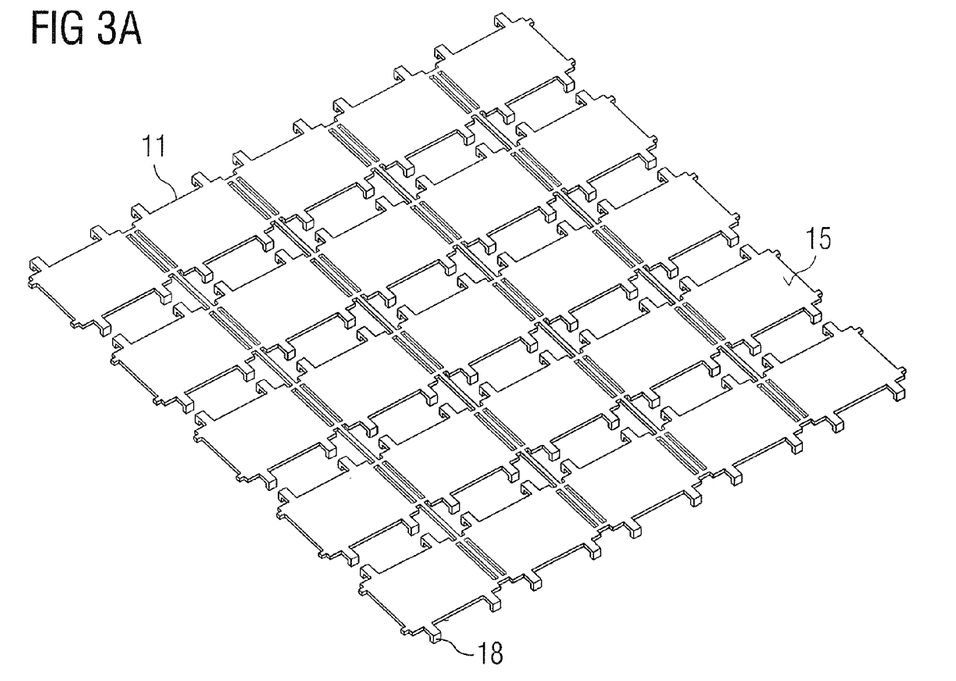
FIGS. 3A to 3E schematically illustrate a method to fabricate a module 300 according to an exemplary embodiment.
Figure 3B:
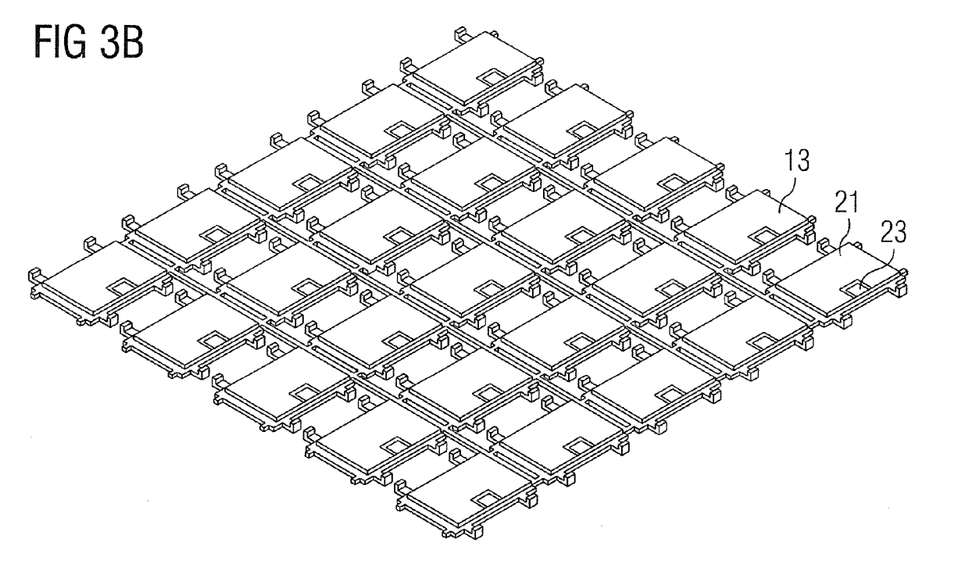
Figure 3C:
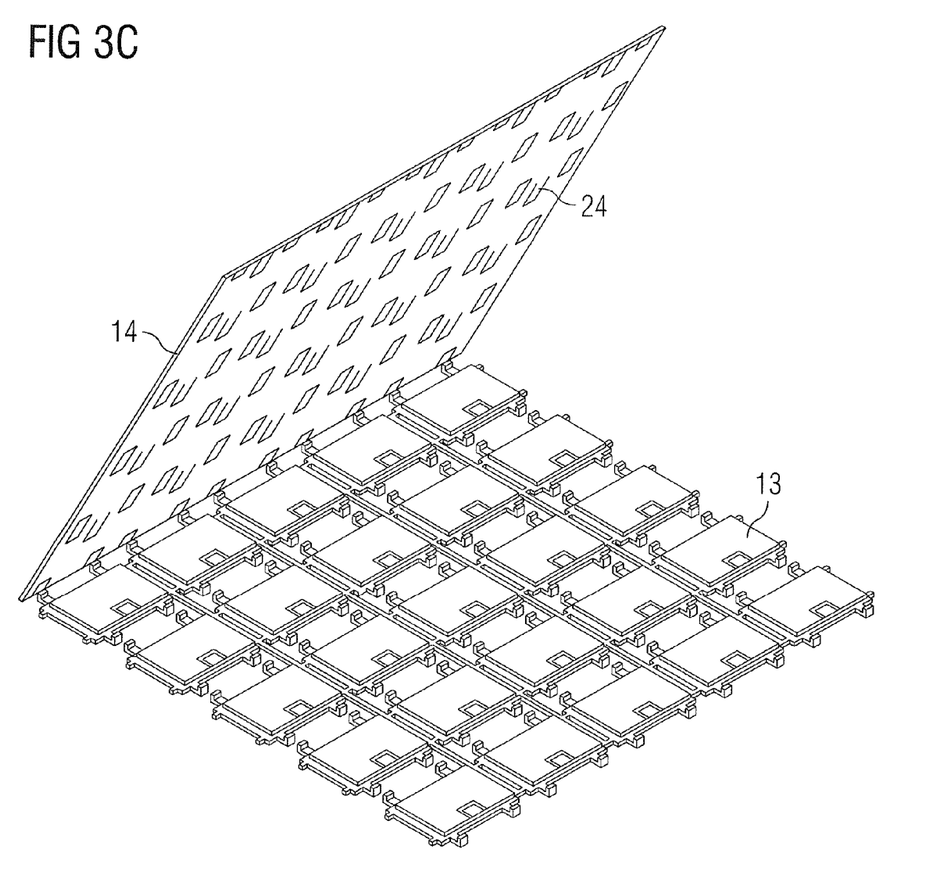
Figure 3D:
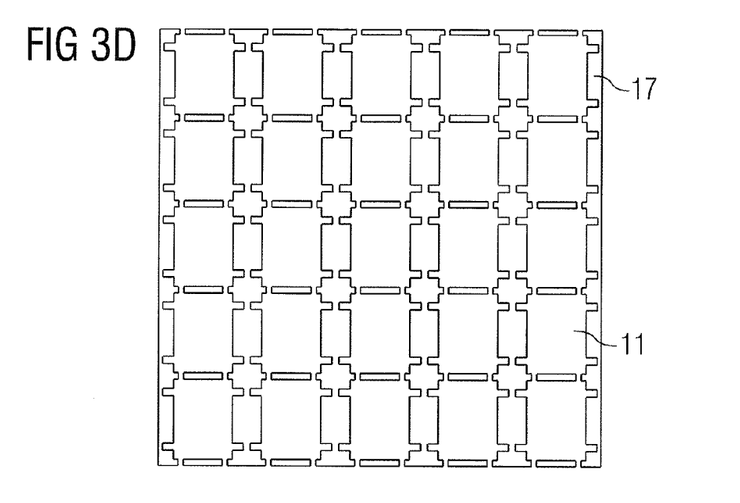
Figure 3E:
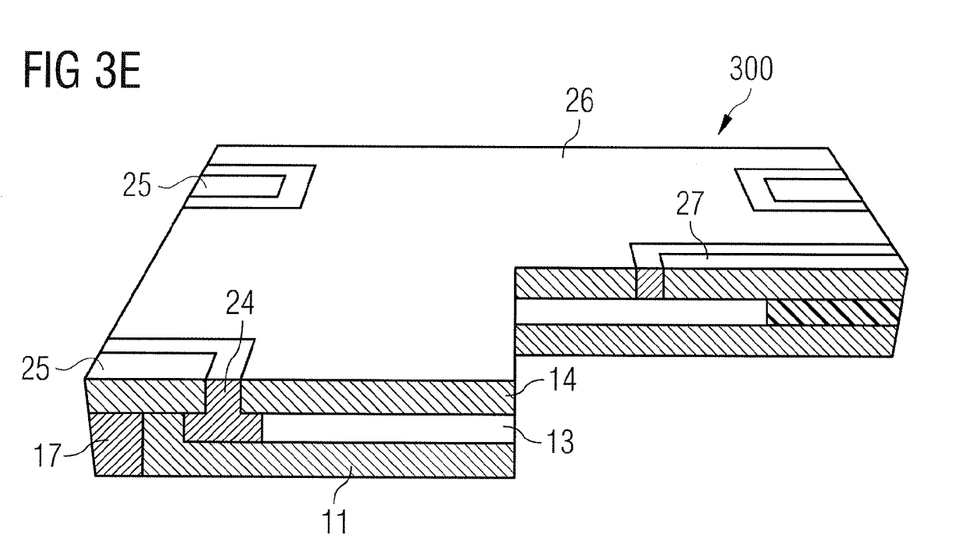

In FIGS. 3A to 3E the fabrication of a module 300, which is shown in FIG. 3E, is schematically illustrated as a further exemplary embodiment in a three-dimensional representation. The module 300 and the fabrication method thereof are similar to the module 200 and the fabrication method thereof. In FIG. 3A the integral array of the first carriers 11 is shown, wherein the first surface 15 faces upwards in FIG. 3A. Each of the first carriers 11 includes four elements 18 which protrude from the first carriers 11. FIG. 3B shows the first semiconductor chips 13 being mounted on the first carriers 11. In the present embodiment, the first semiconductor chips 13 are power transistors. Their drain terminals 19 are electrically coupled to the first carriers 11 and their source terminals 21 and gate terminals 23 face away from the first carriers 11. FIG. 3C shows the integral array of the second carriers 14 being placed over the first semiconductor chips 13. In the present embodiment, the integral array of the second carriers 14 is a plate having recesses 24, which are used to electrically decouple the drain, source and gate terminals 19, 21 and 23 of the first semiconductor chips 11. Both, the integral array of the first carriers 11 and the integral arrays of the second carriers 14 may have members that allow correct alignment of the carriers 11 and 14. For example, these members may function according to the lock-and-key principle so that a member of one of the carriers engages a member of the other carrier to align the carriers 11 and 14. In FIG. 3D the first surface 15 of the first carriers 11 is shown after the molding procedure. In FIG. 3E a single module 300 is shown in a cross section after its separation from the other modules 300. The surfaces 25, 26 and 27 of the module 300 are electrically coupled to the drain, source and gate terminals 19, 21 and 23, respectively. All three surfaces 25, 26 and 27 are electrically insulated from each other by the recesses 24. The recesses 24 may be filled with the mold material 17.

The exposed surfaces of the modules 100, 200 and 300 may be used to electrically couple these module to other components. This is exemplarily shown in FIG. 4. There, an excerpt of a module 400 is schematically illustrated which includes the module 200 that is mounted onto a circuit board 28, for example a PCB (Printed Circuit Board), with the surfaces 25, 26 and 27 facing the circuit board 28. Solder deposits 29 may be used to solder the surfaces 25, 26 and 27 to contact areas of the circuit board 28.

Figure 4:
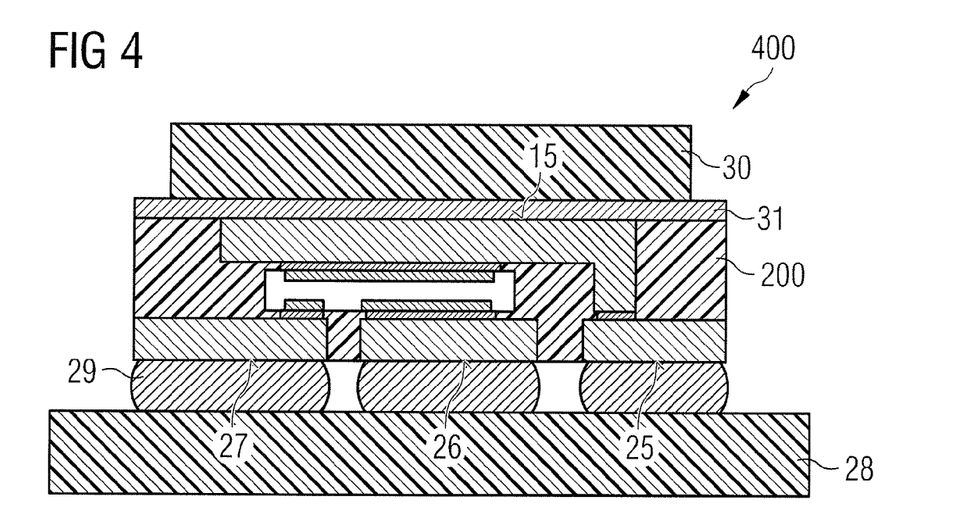
FIG. 4 schematically illustrates a module 400 in a cross section according to an exemplary embodiment.

On top of the module 200, a heat sink or cooling element 30 may be attached. Between the heat sink 30 and the module 200 an electrically insulating layer 31 may be arranged in order to electrically decouple the module 200 from the heat sink 30. If the thermal conductivity of the electrically insulating layer 31 is high enough and/or the material thickness of the electrically insulating layer 31 is small enough, the electrically insulating layer 31 may allow transfer of the heat generated by the first semiconductor chip 13 to the heat sink 30, which dissipates the generated heat.

It may be provided that the modules 100, 200 and 300 include more than the first semiconductor chip 13. Optionally, a second semiconductor chip may be included in each of the modules 100, 200 and 300 and may be placed on the second carrier. Furthermore, a third carrier may be placed over the optional second chip.

Figure 5A:
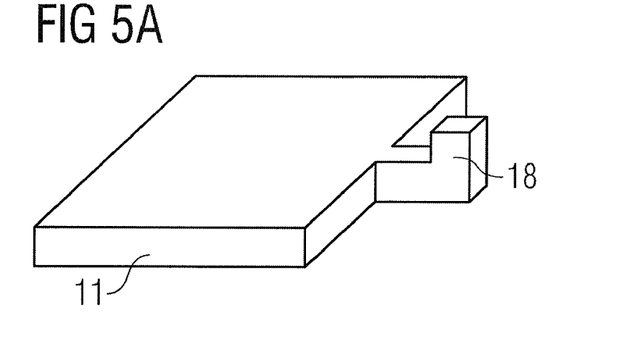
FIGS. 5A to 5D schematically illustrate embodiments of a first carrier 11.
Figure 5B:
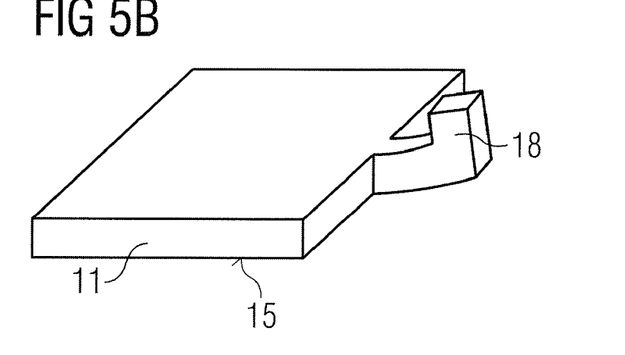

As shown in FIGS. 2A and 3A the first carriers 11 may contain elements 18 which protrude from the first carriers 11. FIG. 5A shows a first carrier 11 with a single element 18 in a three-dimensional representation. In the present embodiment, the end of the element 18 extends perpendicular to the main surfaces of the first carrier 11. The function of the element 18 is to establish an electrical connection between the first carrier 11 and the second carrier 14. In order to facilitate a good electrical connection the element 18 may be resilient. The resilience of the element 18 may be achieved by an decreased width of the element 18 when compared to the width of the first carrier 11 as shown in FIG. 5A. Moreover, the element 18 may be bent upwardly as shown in FIG. 5B. When the second carrier 14 is placed over the first carrier 11, the second carrier 14 may press the element 18 down. This provides a good electrical connection between the first carrier 11 and the second carrier 14 and it further ensures that the element 18 does not pass through the plane determined by the first surface 15 of the first carrier 11.

Figure 5C:
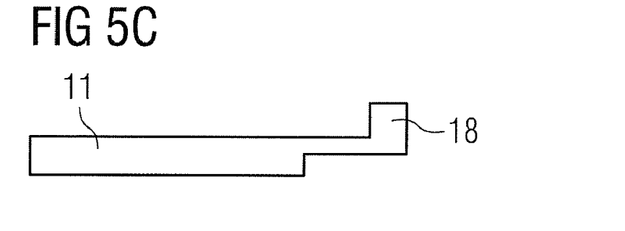
Figure 5D:
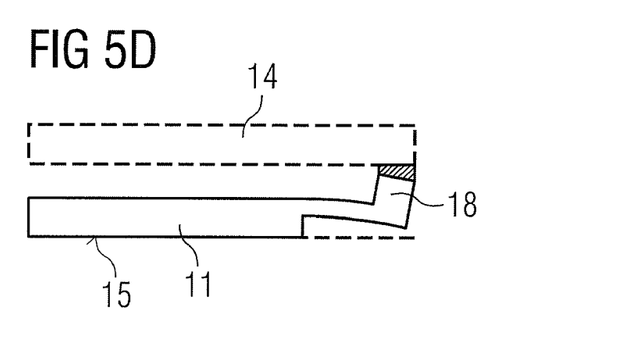

Furthermore, the thickness of the part of the element 18 which is connected to the first carrier 11 may be decreased compared to the thickness of the first carrier 11. For example, a recess may be formed at the bottom of the element 18 as shown in FIG. 5C, where the first carrier 11 and the element 18 are shown in cross section. When the second carrier 14 is placed over the first carrier 11 as indicated in FIG. 5D, the second carrier 14 may press the element 18 down. However, due to the recess of the element 18, the element 18 does not does not pass through the plane determined by the first surface 15.

It is to be noted that the element 18 may also be part of the second or third carriers. Furthermore, other elements may be employed to electrically couple the carriers 11, 14 to each other, and likewise, the optional third carrier.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method, comprising:
providing first integrated circuit chips each comprising a first contact pad on a first main surface and a second contact pad on a second main surface opposite to the first main surface;
arranging the first integrated circuit chips on an integral array of first carriers with the first main surfaces of the first integrated circuit chips facing the integral array of first carriers and the first contact pads being in electrical contact with the integral array of first carriers; and
arranging an integral array of second carriers over the first integrated circuit chips with the second main surfaces of the first integrated circuit chips facing the integral array of second carriers and the second contact pads being in electrical contact with the integral array of second carriers,
wherein the first carriers are electrically coupled to the second carriers and the second contact pads of the first integrated circuit chips by protruding resilient elements of the first or second carriers, wherein the protruding resilient elements of one of the first and second carriers are bent in a direction away from the other of the first and second carriers when the integral array of second carriers is arranged over the first integrated circuit chips and the other of the first and second carriers is pressed against the protruding resilient elements, and wherein the protruding resilient elements are integrally formed with the first carriers or the second carriers.

2. The method of claim 1, further comprising: covering the first integrated circuit chips with a mold material after electrically coupling the first and second carriers.

3. The method of claim 2, wherein the first carriers include first surfaces facing away from the first integrated circuit chips and the second carriers include second surfaces facing away from the first integrated circuit chips, the first surfaces and the second surfaces being arranged plane-parallel.

4. The method of claim 3, wherein the first and second surfaces are left uncovered by the mold material.

5. The method of claim 3, wherein the first surfaces or the second surfaces or both form an assembly plane.

6. The method of claim 2, further comprising: separating the integral arrays of the first and second carriers subsequent to the application of the mold material.

7. The method of claim 1, further comprising: separating the integral arrays of the first and second carriers.

8. The method of claim 1, further comprising: soldering the first carriers or the second carriers or both to the first integrated circuit chips.

9. The method of claim 1, further comprising: arranging second integrated circuit chips on the second carriers.

10. The method of claim 9, further comprising: arranging an integral array of third carriers over the second integrated circuit chips.

11. The method of claim 1, wherein the integral arrays of first carriers or the integral arrays of second carriers or both are leadframe arrays.

12. The method of claim 1, wherein at least one of the first and second carriers has a uniform thickness.

13. The method of claim 1, wherein the first carriers are electrically coupled to the second carriers and the second contact pads along a path outside the first integrated circuit chips.

14. The method of claim 1, wherein a width of the protruding elements is less than a width of the first carriers.

15. The method of claim 1, wherein the resilient elements of one of the first and second carriers are bent in a direction towards the other of the first and second carriers before being brought into contact with the other of the first and second carriers.

16. The method of claim 1, wherein a thickness of the protruding element of one carrier is less than a thickness of a carrier to which the protruding element is attached.

17. The method of claim 1, wherein, after bringing the protruding resilient element of one carrier into contact with another carrier, the protruding element does not pass through a plane defined by the main surface of said another carrier to which the protruding element is attached, which faces away from the first integrated circuit chips.

18. A method, comprising:
providing first integrated circuit chips each comprising a first contact pad on a first main surface and a second contact pad on a second main surface opposite to the first main surface;
arranging the first integrated circuit chips on a first plate in which recesses are formed with the first main surfaces of the first integrated circuit chips facing the first plate and the first contact pads being in electrical contact with the first plate; and
arranging a second plate, in which recesses are formed, over the first integrated circuit chips with the second main surfaces of the first integrated circuit chips facing the second plate and the second contact pads being in electrical contact with the second plate,
wherein the first plate is electrically coupled to the second plate and the second contact pads of the first integrated circuit chips by protruding resilient elements of the first or second plates, the protruding resilient elements being integrally formed with the first plate or the second plate, and wherein the protruding resilient elements are configured to bend such that the protruding resilient elements of the first or second plates move when the other of the first or second plates is pressed against the protruding resilient elements during the arrangement of the second plate over the first plate.

19. The method of claim 18, further comprising: covering the first integrated circuit chips with a mold material.

20. The method of claim 19, wherein the first plate includes a first surface facing away from the first integrated circuit chips and the second plate includes a second surface facing away from the first integrated circuit chips, the first surface and the second surface being arranged plane-parallel.

21. The method of claim 20, wherein the first surface and the second surface are left uncovered by the mold material.

22. The method of claim 19, further comprising: separating the first integrated circuit chips by dividing the first and second plates subsequent to the application of the mold material.

23. The method of claim 18, further comprising: separating the first integrated circuit chips by dividing the first and second plates.

24. The method of claim 18, further comprising: arranging second integrated circuit chips on the second plate.

25. The method of claim 24, further comprising: arranging a third plate over the second integrated circuit chips.

* * * * *